United States Patent [19]
Gonzalez et al.

[11] Patent Number: 6,002,140
[45] Date of Patent: Dec. 14, 1999

[54] METHOD FOR FABRICATING AN ARRAY OF ULTRA-SMALL PORES FOR CHALCOGENIDE MEMORY CELLS

[75] Inventors: Fernando Gonzalez; Raymond A. Turi, both of Boise, Id.

[73] Assignee: Micron Technology, Inc., Boise, Id.

[21] Appl. No.: 08/846,728

[22] Filed: Apr. 30, 1997

Related U.S. Application Data

[62] Division of application No. 08/473,077, Jun. 7, 1995, Pat. No. 5,879,955.

[51] Int. Cl.$^6$ .................................................. H01L 27/24
[52] U.S. Cl. .................................. 257/3; 257/5; 438/637; 438/102
[58] Field of Search ................................. 257/3–5, 774, 257/773; 438/900, 637, 102

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |

(List continued on next page.)

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Poly-crystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance p–n–p Polysilicon Emitter Bipolar Transistors," *IEEE*, 13(8):408–410, 1992.

(List continued on next page.)

*Primary Examiner*—John Guay
*Attorney, Agent, or Firm*—Fletcher, Yoder & Van Someren

[57] ABSTRACT

A method for fabricating an array of ultra-small pores for use in chalcogenide memory cells. A layer of a first material is applied onto a substrate. A portion of the layer of the first material is then removed to define an upper surface with vertical surfaces extending therefrom to a lower surface in the first layer of the first material. A fixed layer of a second material is then applied onto the vertical surfaces of the first layer of the first material. The fixed layer of the second material has a first thickness. A second layer of the first material is then applied onto the fixed layer of the second material. The fixed layer of the second material is then removed to define an array of pores in the first material layers. The pores thus defined have minimum lateral dimensions ranging from approximately 50 to 500 Angstroms and cross sectional areas greater than or equal to the first thickness of the second layer squared. The pores thus defined are further equally spaced from adjacent pores by a spacing ranging from approximately 0.25 to 0.5 microns. The pores thus defined may then be used to fabricate an array of chalcogenide memory cells.

37 Claims, 6 Drawing Sheets

OTHER PUBLICATIONS

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phy.*, 53(12):8827–8834, 1992.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

U.S. PATENT DOCUMENTS

| Number | Date | Name | Class |
|---|---|---|---|
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,630,355 | 12/1986 | Johnson | 29/575 |
| 4,642,140 | 2/1987 | Noufi et al. | 148/6.24 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,795,657 | 1/1989 | Formigoni et al. | 427/96 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,216,282 | 6/1993 | Cote et al. | 257/773 |
| 5,293,335 | 3/1994 | Pernisz et al. | 365/148 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,414,271 | 5/1995 | Ovshinsky et al. | 257/3 |
| 5,510,629 | 4/1996 | Karpovich et al. | 257/50 |
| 5,534,711 | 7/1996 | Ovshinsky et al. | 257/3 |
| 5,534,712 | 7/1996 | Ovshinsky et al. | 217/3 |

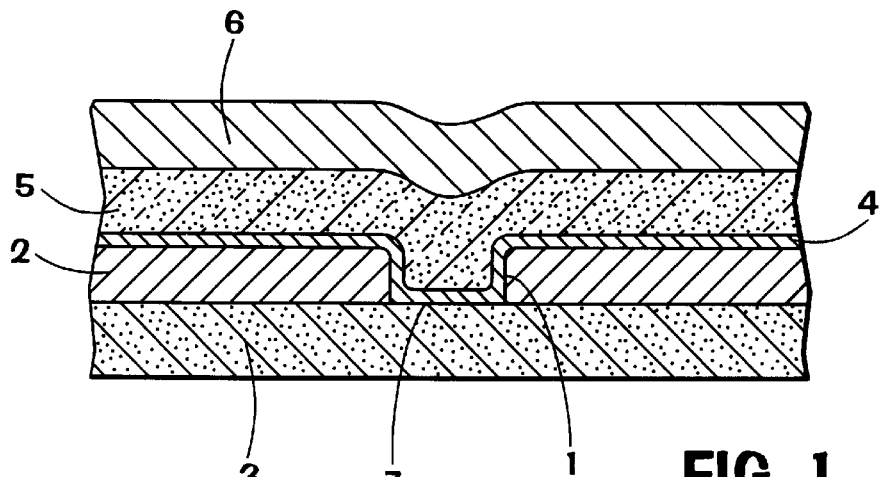
FIG. 1
(PRIOR ART)
FIG. 2
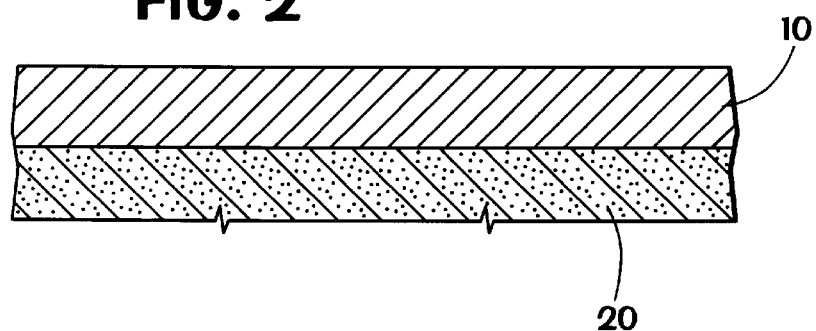
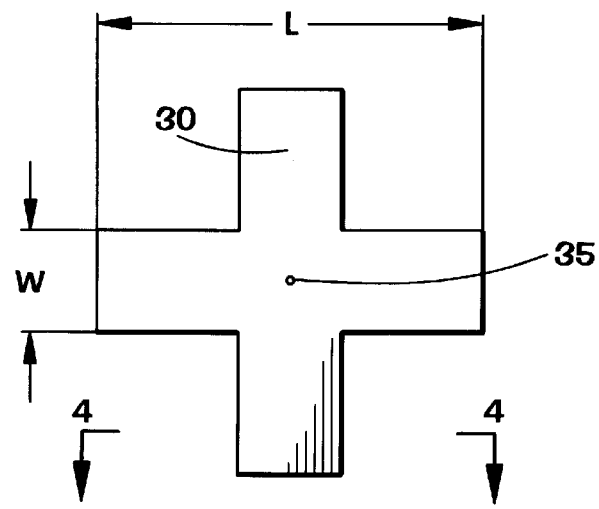
FIG. 3

METHOD FOR FABRICATING AN ARRAY OF ULTRA-SMALL PORES FOR CHALCOGENIDE MEMORY CELLS

This application is a Divisional of application Ser. No. 08/473,077, filed Jun. 7, 1995, now U.S. Pat. No. 5,879,955.

BACKGROUND OF THE INVENTION

The present invention relates generally to semiconductor fabrication techniques and, more particularly, to a method for fabricating ultra-small pores for use in phase or state changeable memory devices such as, for example, chalcogenide memory cells.

The use of electrically writable and erasable phase change materials (i.e., materials which can be electrically switched between generally amorphous and generally crystalline states or between different resistive states while in crystalline form) for electronic memory applications is known in the art and is disclosed, for example, in U.S. Pat. No. 5,296,716 to Ovshinsky et al., the disclosure of which is incorporated herein by reference. U.S. Pat. No. 5,296,716 is believed to generally indicate the state of the art, and to contain a discussion of the current theory of operation of chalcogenide materials.

Generally, as disclosed in the aforementioned Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states but rather the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity than it does in its crystalline state.

These memory cells are monolithic, homogeneous, and formed of chalcogenide material selected from the group of Te, Se, Sb, Ni, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. Furthermore the data integrity of the information stored by these memory cells is not lost when power is removed from the device. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and thereby storing multiple bits of binary encoded information as a single resistance value in a single cell.

The operation of chalcogenide memory cells requires that a region of the chalcogenide memory material, called the chalcogenide active region, be subjected to a current pulse typically with a current density between about $10^5$ and $10^7$ amperes/cm$^2$, to change the crystalline state of the chalcogenide material within the active region contained within a small pore. This current density may be accomplished by first creating a small opening 1 in a dielectric material 2 which is itself deposited onto a lower electrode material 3 as illustrated in FIG. 1. A second dielectric layer 4, typically of silicon nitride, is then deposited onto the dielectric layer 2 and into the opening 1. The second dielectric layer 4 is typically on the order of 40 Angstroms thick. The chalcogenide material 5 is then deposited over the second dielectric material 4 and into the opening 1. An upper electrode material 6 is then deposited over the chalcogenide material 5. Carbon is a commonly used electrode material although other materials have also been used, for example, molybdenum and titanium nitride. A conductive path is then provided from the chalcogenide material 5 to the lower electrode material 3 by forming a pore 7 in the second dielectric layer 4 by the welt known process of popping. Popping involves passing an initial high current pulse through the structure which passes through the chalcogenide material 5 and then provides dielectric breakdown of the second dielectric layer 4 thereby providing a conductive path via the pore 7 through the memory cell.

Electrically popping the thin silicon nitride layer 4 is not desirable for a high density memory product due to the high current required and the large amount of testing time that is required for the popping.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (diameter, thickness, and volume), chalcogenide composition, signal pulse duration and signal pulse waveform shape have an effect on the magnitude of the dynamic range of resistances, the absolute endpoint resistances of the dynamic range, and the voltages required to set the memory cells at these resistances. For example, relatively thick chalcogenide films (e.g., about 4000 Angstroms) will result in higher programming voltage requirements (e.g., about 15–25 volts), while relatively thin chalcogenide layers (e.g., about 500 Angstroms) will result in lower programming voltage requirements (e.g., about 1–7 volts). The most important factor in reducing the required programming voltage is the pore cross sectional area.

The energy input required to adjust the crystalline state of the chalcogenide active region of the memory cell is directly proportional to the dimensions of the minimum lateral dimension of the pore (e.g., smaller pore sizes result in smaller energy input requirement). Conventional chalcogenide memory cell fabrication techniques provide a minimum lateral pore dimension, diameter or width of the pore, that is limited by the photolithographic size limit. This results in pore sizes having minimum lateral dimensions down to approximately 1 micron.

The present invention is directed to overcoming, or at least reducing the affects of, one or more of the problems set forth above. In particular, the present invention provides a method for fabricating ultra-small pores for chalcogenide memory cells with minimum lateral dimensions below the photolithographic limit thereby reducing the required energy input to the chalcogenide active region in operation. The present invention further eliminates the unpredictable prior art method of pore formation by electrical breakdown of a thin silicon nitride layer to form a small pore. As a result, the memory cells may be made smaller to provide denser memory arrays, and the overall power requirements for the memory cell are minimized.

SUMMARY OF THE INVENTION

The present invention provides a new method for fabricating an array of ultra-small pores for use in chalcogenide memory cells. A layer of a first material is applied onto a substrate. A portion of the layer of the first material is then removed to define an upper surface with vertical surfaces extending therefrom to a lower surface in the first layer of the first material. A fixed layer of a second material is then applied onto the vertical surfaces of the first layer of the first material. The fixed layer of the second material has a first thickness. A second layer of the first material is then applied onto the fixed layer of the second material. The fixed layer of the second material is then removed to define an array of pores in the first material layers.

DESCRIPTION OF THE DRAWINGS

The present invention will become more fully understood from the following detailed description of the preferred embodiments, taken in conjunction with the accompanying drawings in which:

FIG. 1 is a fragmentary cross sectional view illustrating a portion of a single conventional chalcogenide memory cell;

FIG. 2 is a fragmentary cross sectional view of a deposition of a layer of silicon nitride onto a substrate;

FIG. 3 is an overhead view of a cross shaped region and surrounding cavity region formed in the layer of silicon nitride;

DETAILED DESCRIPTION OF PREFERRED EMBODIMENTS

A method of fabricating pores is presented that provides pore sizes smaller than that presently provided using conventional photolithographic methods. The method further eliminates the unpredictable results provided by the conventional method of pore formation by dielectric breakdown of a thin silicon nitride layer. In particular, the preferred embodiment of the present invention provides a method of fabricating pores that relies upon the thickness of a thin film of silicon dioxide, having been applied to an edge feature of an underlying layer of silicon nitride, to define the minimum lateral dimension of the pore. In this manner, pore sizes having minimum lateral dimensions as small as around 50 to 500 Angstroms are obtained.

Turning to the drawings and referring initially to FIG. 2, a preferred embodiment of the present invention will now be described. As illustrated in FIG. 2, a first layer 10 of silicon nitride is deposited onto a substrate 20 using conventional thin film deposition techniques. The first layer 10 of silicon nitride may have a uniform thickness ranging from approximately 1000 to 3000 Angstroms, and preferably it has a uniform thickness of around 2400 Angstroms. The substrate will preferably comprise a suitable material for use as a lower electrode or conductive channel for use in a chalcogenide memory cell.

Figure 4:
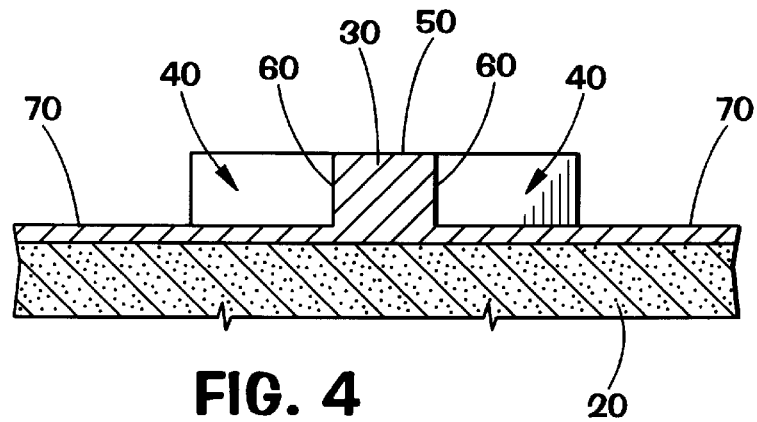
FIG. 4 is a fragmentary cross sectional view of the cross shaped region and surrounding cavity region formed in the layer of silicon nitride.

The layer 10 is then etched using conventional anisotropic etching techniques to provide a cross shaped region 30 surrounded by a cavity 40 as illustrated in FIGS. 3 and 4. The cross shaped region 30 includes an upper horizontal surface 50 and generally vertical surfaces 60 extending downwardly therefrom to a lower horizontal surface 70. The location of the cross shaped region 30 is further defined by a center point 35. The width w of the horizontal surface 50 in the arms of the cross shaped region 30 may vary from approximately 0.25 to 0.50 microns, and preferably the width w is around 0.40 microns. The lengths L of the two arms of the cross shaped region 30 may range from approximately 0.50 to 1.00 microns from end to end, and preferably are around 0.80 microns. The etching process will remove a volume of material sufficient to reduce the thickness of the layer 10 within the cavity region 40 to between approximately 100 and 500 Angstroms, and preferably to around 200 Angstroms.

Figure 5:
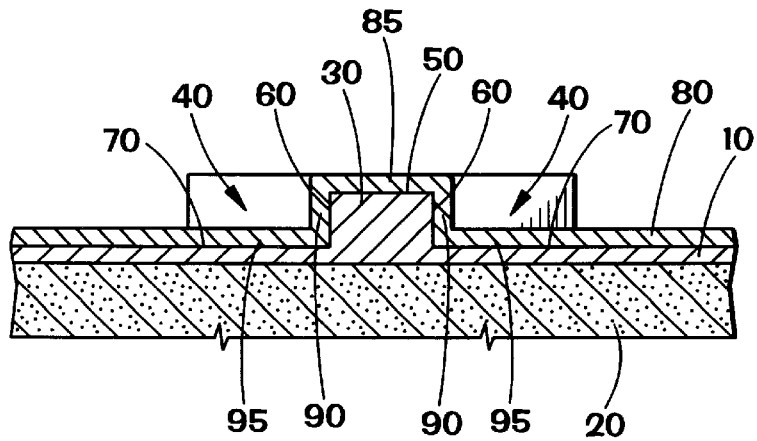
FIG. 5 is a fragmentary cross sectional view of a deposition of a layer of silicon dioxide onto the cross shaped region and cavity region of the silicon nitride layer.

As illustrated in FIG. 5, a layer 80 of silicon dioxide is then deposited onto the horizontal and vertical surfaces, 50 and 60 respectively, of the cross shaped region 30 and the horizontal surface 70 of the cavity region 40 using conventional thin film deposition techniques. The layer 80 of silicon dioxide includes an upper horizontal cross shaped layer 85 and vertical layers 90 extending therefrom to a lower horizontal layer 95. The upper cross shaped layer 85 includes corners 86, 87, 88, and 89 defining the beginning of the arms extending from the central square region of the cross shaped layer 85. The layer 80 may have a uniform thickness ranging from approximately 50 to 500 Angstroms, and preferably it has a uniform thickness of around 250 Angstroms. The selected thickness of the layer 80 of silicon dioxide determines the final minimum lateral dimension of the pores fabricated by the method of the present preferred embodiment.

Figure 6:
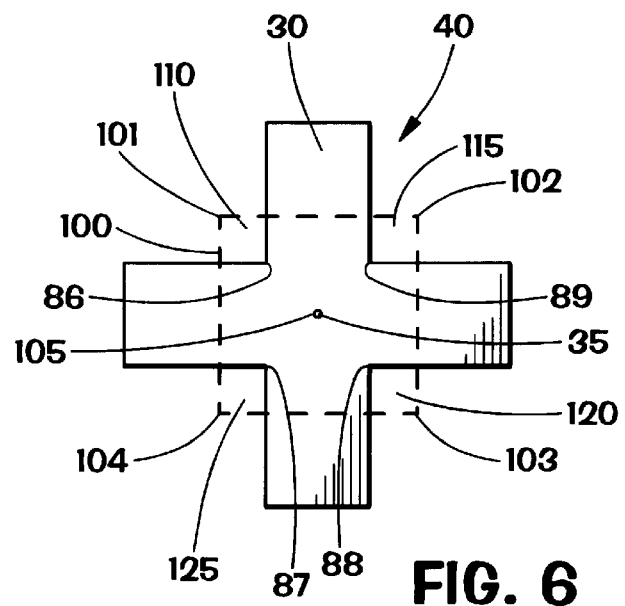
FIG. 6 is an overhead view of a square mask applied to the layer of silicon dioxide which overlaps a cross shaped upper horizontal surface of the silicon dioxide layer.
Figure 7:
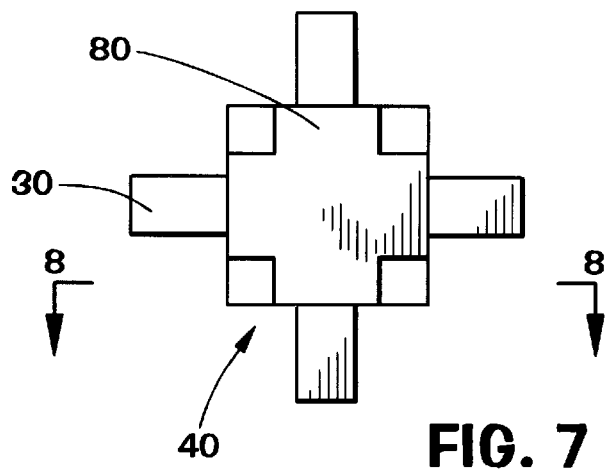
FIG. 7 is an overhead view of a remaining portion of the silicon dioxide layer following an anisotropic etching process.
Figure 8:
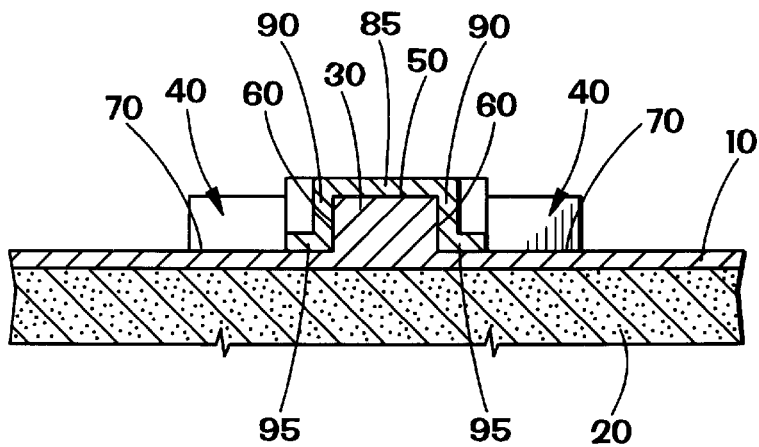
FIG. 8 is a fragmentary cross sectional view of the remaining portion of the silicon dioxide layer and the underlying silicon nitride layer following the anisotropic etching process.

A square area 100 is then masked prior to anisotropic etching of the layer 80 of silicon dioxide using conventional etching techniques as illustrated in FIG. 6. The portion of the layer 80 of silicon dioxide masked off within the square area 100 remains after the etching process as illustrated in FIGS. 7 and 8. The square area 100 is preferably positioned using known techniques such that a center point 105 of the square area 100 is coincident with the center point 35 of the cross shaped region 30. The square area 100 is further oriented to mask four substantially equal square areas 110, 115, 120, and 125 within the cavity region 40. The square area 100 may range from approximately 4500 to 10000 Angstroms on a side, and preferably is about 6000 Angstroms on a side. The square area 100 includes corners 101, 102, 103, and 104. The use of an overlapping square shaped mask overlaying the cross shaped member 30 results in a technique of fabrication that is extremely tolerant of misalignment in the positioning of the square mask 100 relative to the cross shaped member 30.

The method of the preferred embodiment provides a means of simultaneously fabricating four equally spaced pores for a memory cell array that comprises four equally spaced memory cells. It further provides a means of fabricating four staggered pores that serve as a basis for a memory cell array that comprises two adjacent memory cells each including a pair of pores. It still further provides a means of fabricating four staggered pores that serve as a basis for a single memory cell that utilizes all four pores. The memory cell that utilizes all four pores is extremely tolerant of misalignment of the square mask 100 and the cross shaped region 30 since the total cross sectional area of the four pores of the memory cell will be constant regardless of misalignment of these features.

Figure 9:
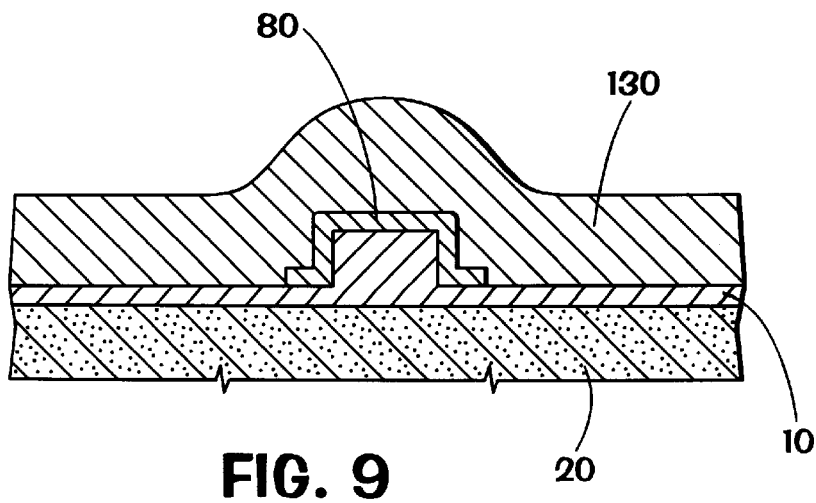
FIG. 9 is a fragmentary cross sectional view of the remaining portion of the silicon dioxide layer and underlying silicon nitride layer following a deposition of silicon nitride.

A second layer 130 of silicon nitride is then deposited onto the entire structure covering the layer 80 of silicon dioxide and completely filling the cavity region 40 using conventional thin film deposition techniques, as illustrated in FIG. 9. The layer 130 of silicon nitride may be applied to provide a minimum coating thickness over the upper horizontal cross shaped layer 85 of silicon dioxide ranging from approximately 500 to 3000 Angstroms, and preferably provides a minimum coating thickness of at least about 2500 Angstroms.

Figure 10:
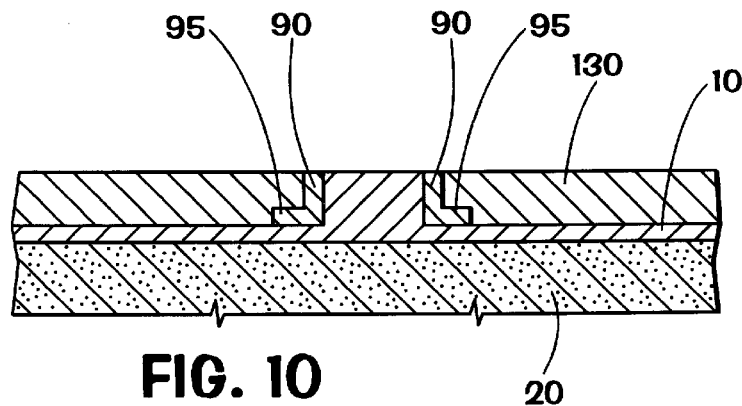
FIG. 10 is a fragmentary cross sectional view of the remaining portion of the silicon dioxide layer and the silicon nitride layers following a chemical and mechanical polish planarization.

The entire structure is then subjected to chemical and mechanical polishing (CMP) planarization using conventional techniques to provide a smooth upper planar surface and also to expose the upper portion of the vertical layers 90 of silicon dioxide as shown in FIG. 10.

Figure 11:
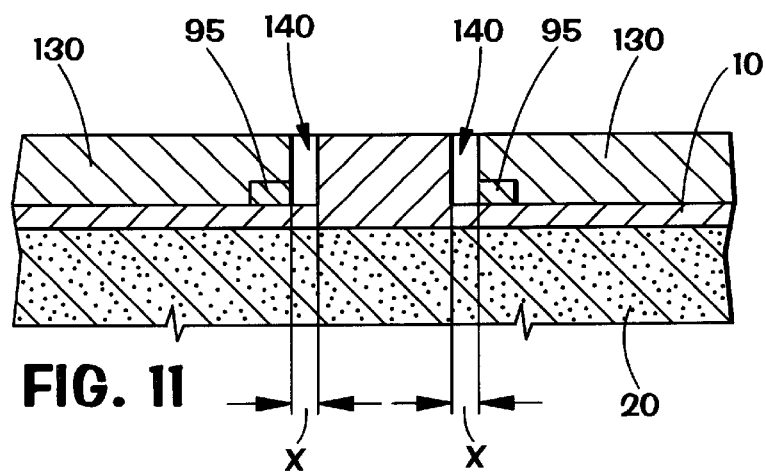
FIG. 11 is a fragmentary cross sectional view of the openings formed in the silicon nitride layers following a differential anisotropic etching of the silicon dioxide and silicon nitride layers.
Figure 12:
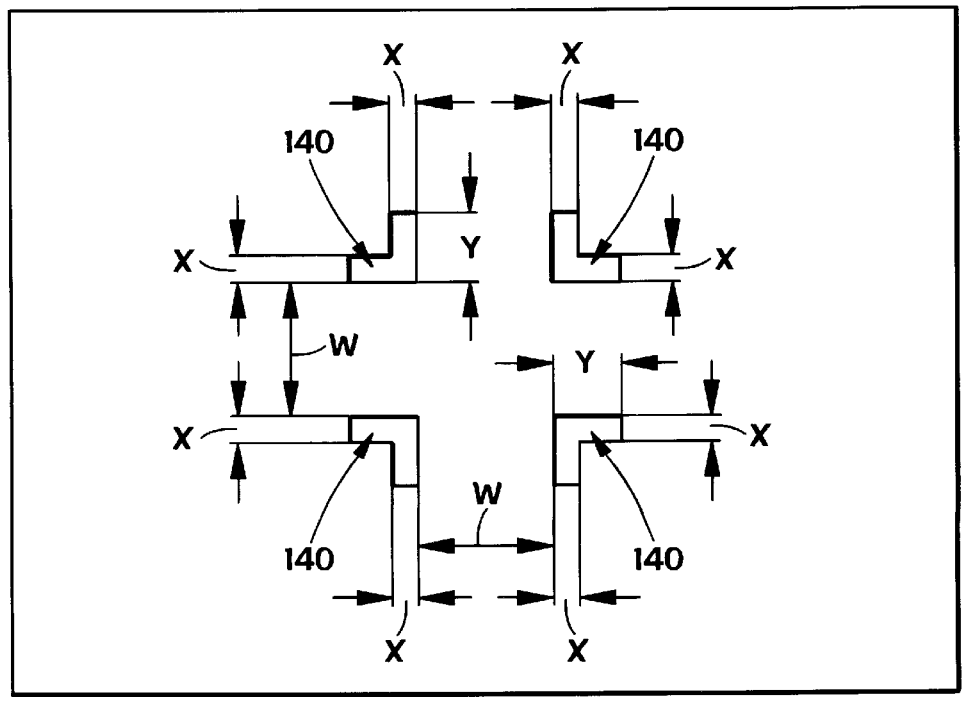
FIG. 12 is an overhead view of the openings formed in the silicon nitride layers following the differential anisotropic etching of the silicon dioxide and silicon nitride layers.

The entire structure is then subjected to a dry anisotropic, differential etching process, where the etch rate for the silicon dioxide is greater than that for the silicon nitride, using conventional techniques. The resulting structure following the differential etching process includes pores 140 where the vertical layers 90 of silicon dioxide have been removed as illustrated in FIG. 11. The minimum lateral dimensions x of the pores 140 are equal to the selected thickness of the layer 80 of silicon dioxide which may range from approximately 50 to 500 Angstroms, and preferably it is around 250 Angstroms. The pores 140 further have L-shaped cross sections as illustrated in FIG. 12 with legs of length y. The length y will be a function of the dimensions of the square mask 100. Adjacent pores 140 will be spaced apart from each other by dimension w of the arms of the cross shaped regions 30 which may range from approximately 0.25 to 0.5 microns, and preferably are about 0.40 microns.

The larger the overlap of the square mask 100 over the cross shaped region 30, the larger the lengths y of the legs of the L-shaped pores 140. The length y of the L-shaped pores 140 will be equal to the dimension of the side of the square mask 100 minus the width w of the arms of the cross shaped region 30 divided by 2. The cross sectional shapes of the pores 140 may be reduced to square shaped cross sections by proper initial selection of the cross shaped region 30 and the square mask 100 resulting in minimum cross sectional areas for pores 140 equal to $x^2$. In particular for selection of the square mask 100 with corners 101, 102, 103, and 104 coincident with corners 86, 87, 88, and 89 of the cross shaped horizontal layer 85 of silicon dioxide, the resulting cross sectional areas for the pores 140 are equal to $x^2$.

Figure 13:
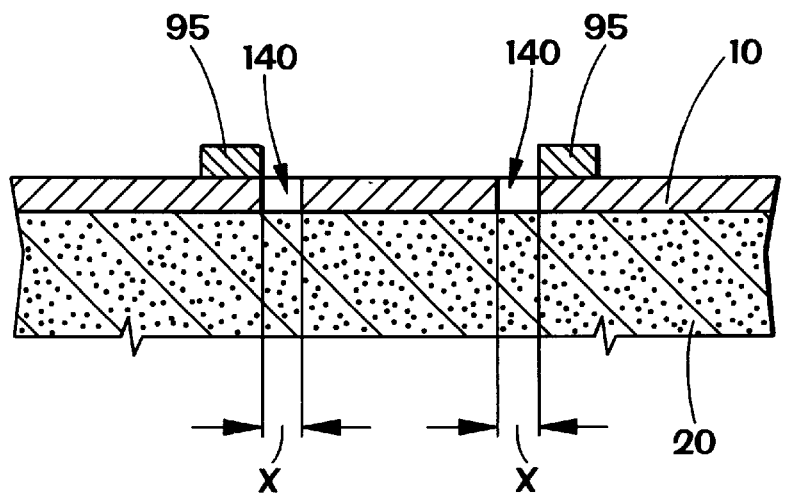
FIG. 13 is a fragmentary cross sectional view of the pores formed in the silicon nitride layers following an anisotropic etching of the silicon nitride layers.
Figure 14:
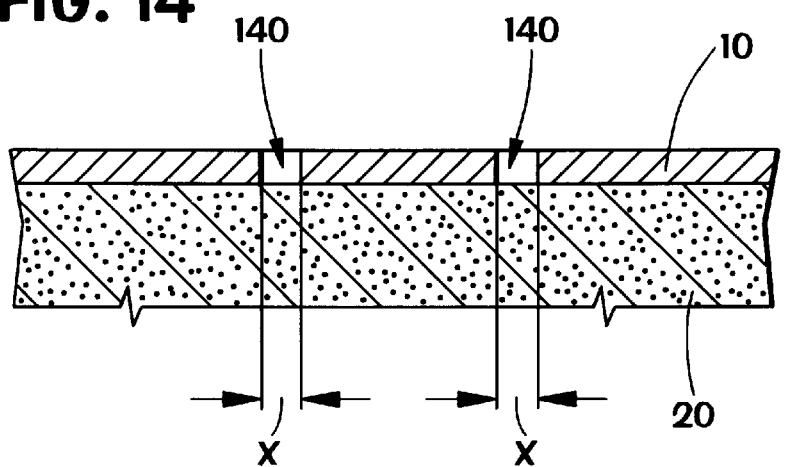
FIG. 14 is a fragmentary cross sectional view of the final structure following the final step of anisotropic etching of the remaining portion of the silicon dioxide layer.

The entire structure is then subjected to an conventional anisotropic etch of the silicon nitride material which extends the pores 140 to the top surface of the substrate 20, as illustrated in FIG. 13. The remaining horizontal layers 95 of silicon dioxide are then removed by a conventional etching process as illustrated in FIG. 14.

Other materials may be utilized in fabricating the array of pores of the final structure. For example, silicon dioxide may utilized in place of the layers of silicon nitride and polysilicon may be utilized in place of silicon dioxide. More generally, the teachings of the present preferred embodiment may be utilized to fabricate a single pore or an array of ultra-small pores utilizing materials capable of use with conventional anisotropic etching and masking processes.

The array of pores 140 of the final structure are preferably symmetrically positioned with respect to each other and separated from adjacent pores by a spacing ranging from approximately 0.25 to 0.50 microns as defined by the selected dimensions for the width w of the arms of the cross shaped region 30. In a preferred embodiment, the final structure of the present preferred embodiment includes four equally spaced pores 140. Staggered pores 140 may be utilized for a memory cell that employs a pair or all four of the pores since a memory cell with multiple pores is tolerant of misalignment in previous masking operations.

Figure 15:
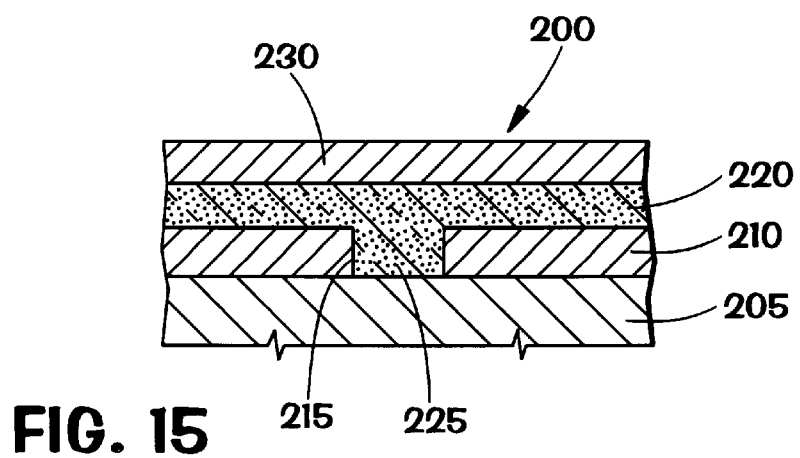
FIG. 15 is a fragmentary cross sectional view illustrating a portion of a chalcogenide memory cell fabricated in accordance with the method of the presently preferred embodiment that utilizes a single pore.

The preferred embodiment of the present invention may be utilized to fabricate an array of phase-changeable memory cell such as, for example, a chalcogenide memory cell 200 as illustrated in FIG. 15. In fabricating such chalcogenide memory cells 200 the present preferred embodiment for fabricating an array of ultra-small pores is combined with conventional fabrication techniques utilized in the manufacture of such chalcogenide memory cells to provide one cell or an array of such chalcogenide memory cells. The memory cells fabricated utilizing the method of the preferred embodiment further may utilize a single pore, two pores, or all four of the pores fabricated adjacent to a cross shaped region 30.

A chalcogenide memory cell 200 is illustrated in FIG. 15 that includes a lower electrode layer 205, a dielectric layer 210 including a single pore 215, a layer of a chalcogenide memory material 220 including a chalcogenide active region 225, and an upper electrode layer 230. The pore 215 is formed by the method of the present preferred embodiment which provide a group of four equally spaced pores. The remaining structure of the memory cell 200 is formed using conventional thin film deposition and etching techniques. Thus a group of four closely spaced chalcogenide memory cells 200 may be provided by the group of four pores fabricated adjacent to a single cross shaped region 30.

Figure 16:
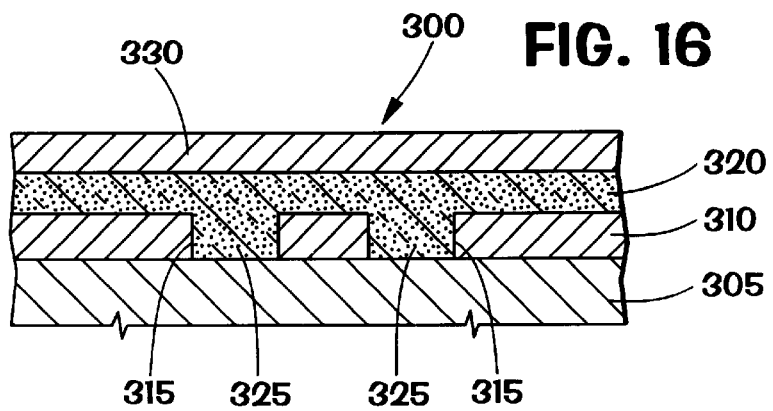
FIG. 16 is a fragmentary cross sectional view illustrating a portion of a chalcogenide memory cell fabricated in accordance with the method of the presently preferred embodiment that utilizes multiple pores.

A chalcogenide memory cell is illustrated in FIG. 16 that utilizes two or all four of the ultra-small pores formed by the method of present preferred embodiment. The chalcogenide memory cell 300 includes a lower electrode layer 305, a dielectric layer 310 including pores 315, a layer of a chalcogenide memory material 320 including chalcogenide active regions 325, and an upper electrode layer 330. The pores 315 are formed by the method of the present preferred embodiment. The remaining structure of the memory cell 300 is formed using conventional thin film deposition and etching techniques. The chalcogenide memory cell 300 thus formed is centrally positioned over the four pores formed adjacent to a single cross shaped member 30 by the method of the present preferred embodiment.

The method of the presently preferred embodiment thus provides a means of fabricating memory cells that utilize one or more pores. In particular, the use of all four pores in a memory cell results in a structure that is extremely tolerant of misalignment in the previous masking processes since the total cross sectional area of the pores used will be constant. Likewise a memory cell that employs a pair of adjacent pores will also be tolerant of misalignment.

Figure 17:
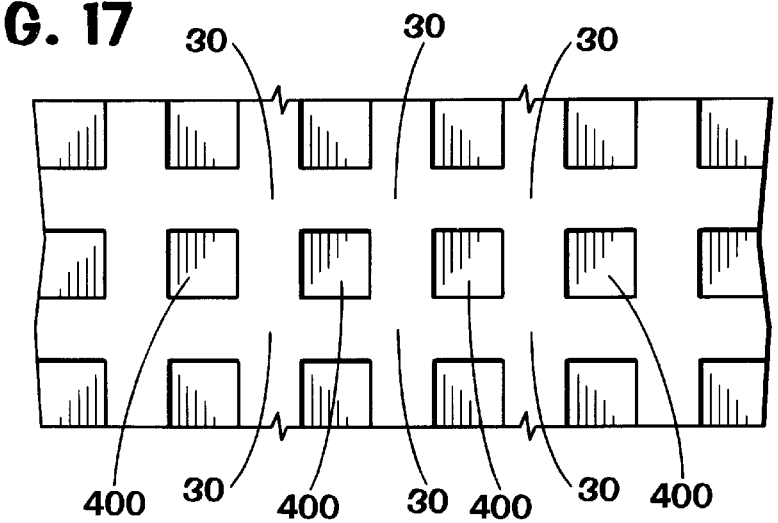
FIG. 17 is a top view of an array of cross shaped regions for fabricating an array of equally spaced groups of pores.
Figure 18:
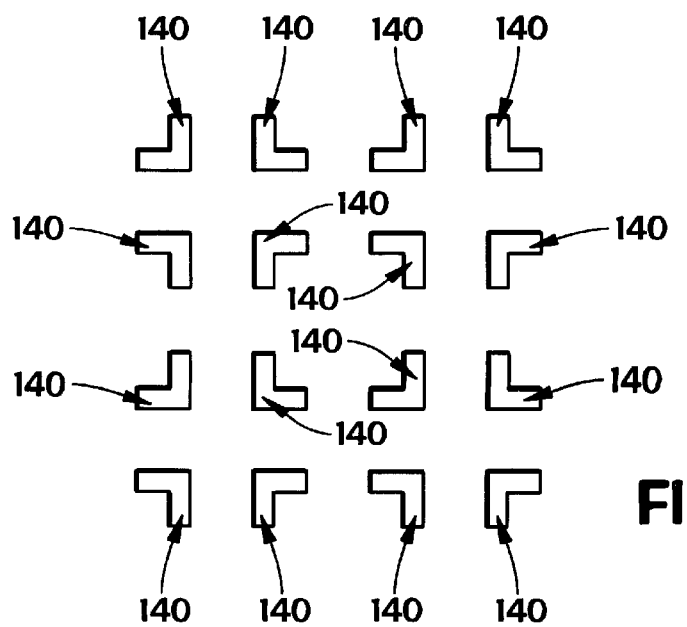
FIG. 18 is a top view of an array of pores fabricated the method of the preferred embodiment utilizing an array of cross shaped regions.

More generally, the fabrication techniques of the present preferred embodiment may be utilized to fabricate an array of such pores by etching an array of interconnected cross shaped regions 30 in the first layer 10 as illustrated in FIG. 17. The interconnected cross shaped regions 30 are spaced apart by cavity regions 400. Utilizing the method of the presently preferred embodiment, such a structure provides adjacent groupings of such pores 140 equally spaced from other groupings to thereby form a matrix of such pores 140 as illustrated in FIG. 18.

By providing a chalcogenide memory cell centered at a single pore or centered over all four pores fabricated adjacent a cross shaped member by the method of the presently preferred embodiment an array of memory cells is produced. This is facilitated by providing, in a well known manner, a substrate that includes a corresponding array of conductive regions which provide lower electrodes for each of the memory cells. These memory cells are preferably made individually addressable by further providing an x-y matrix of conductive channels above and below the memory cells, in a well known manner, as disclosed in U.S. Pat. No. 5,296,716 to Ovshinsky et al. Preferably these individually addressable memory cells are also electrically isolated from other memory cells in the array, in a well known manner, by the addition of diodes or other similar access devices which are connected in series between each memory cell and one of the x-y conductive channels as also disclosed in the aforementioned Ovshinsky patent.

Typical chalcogenide compositions for these memory cells include average concentrations of Te in the amorphous state well below 70%, typically below about 60% and ranging in general from as low as about 23% up to about 56% Te and most preferably to about 48% to 56% Te. Concentrations of Ge are typically above about 15% and range from a low of about 17% to about 44% average in the high resistance state, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_a Ge_b Sb_{100-(a+b)}$, where a is equal to or less than about 70% and preferably between about 60% to about 40%, b is above about 15% and less than 50%, preferably between about 17% to about 44% and the remainder is Sb.

A method for fabricating ultra-small pores in a layer of a first material has been presented for use in providing pores whose minimum lateral dimensions are defined by the thickness of a layer of a second material applied to an edge feature of the first material. In an exemplary embodiment, the method provides pores having a minimum lateral dimension of about 500 Angstroms with a minimum cross sectional area of about 0.03 microns$^2$. The method further provides a means of fabricating an array of pores simultaneously to thereby permit a grid of chalcogenide memory cells to be grouped together in close proximity.

The present method may be used to provide pores in a layer of material using raised surfaces with vertical depending surfaces having geometries other than the cross shaped surface disclosed in the description of the preferred embodiment. More generally the teachings of the present method enable the fabrication of ultra small pores based upon any edge feature of a material layer and may be further used to fabricate one or a plurality of such pores simultaneously.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. An array of pores fabricated by a process comprising the steps of:

applying a first layer of a first material onto a substrate;

removing a portion of said first layer of said first material to define a cross-shaped upper surface with generally vertical surfaces extending therefrom to a lower surface in said first layer of said first material;

applying a fixed layer of a second material onto said generally vertical surfaces of said first layer of said first material, said fixed layer of said second material having a first thickness;

applying a second layer of said first material onto said fixed layer of said second material; and removing said fixed layer of said second material to define said array of pores in said first material layers.

2. The array of pores of claim 1, wherein said pores have a minimum lateral dimension ranging from approximately 50 to 500 Angstroms.

3. The array of pores of claim 1, wherein said pores have a cross sectional area greater than or equal to said first thickness of said layer of said second material squared.

4. The array of pores of claim 1, wherein said pores have a minimum lateral dimension ranging from approximately 50 to 500 Angstroms; and wherein said pores have a cross sectional area greater than or equal to said first thickness of said layer of said second material squared.

5. The array of pores of claim 1, wherein said upper surface is generally horizontal.

6. The array of pores of claim 5, wherein said cross shaped horizontal upper surface includes a pair of arms extending relative to a central point.

7. The array of pores of claim 6, wherein said arms of said cross shaped horizontal upper surface range in length from about 0.5 to 1 micron.

8. The array of pores of claim wherein said upper surface is surrounded by a recess defined in part by said lower surface.

9. The array of pores of claim 8, wherein said upper surface includes a plurality of arms extending laterally relative to a generally central location.

10. The array of pores of claim 1, wherein said first material is comprised of silicon nitride.

11. The array of pores of claim 1, wherein said second material is comprised of silicon dioxide.

12. The array of pores of claim 1, wherein said first material is comprised of silicone nitride and wherein said second material is comprised of silicon dioxide.

13. An array of chalcogenide memory cells, comprising:
a plurality of chalcogenide memory cells positioned in a generally common plane, each said chalcogenide memory cell including:
an upper electrode;
a lower electrode;
a dielectric layer positioned between said upper and lower electrodes and including an opening defining a pore having an L-shaped cross section;
a chalcogenide element within said pore, said chalcogenide element electrically coupled to said upper and lower electrodes.

14. The array of claim 13, wherein a minimum lateral dimension of said pores ranges from about 50 to 500 Angstroms.

15. The array of claim 13, wherein pores of adjacent chalcogenide memory cells are spaced apart by a distance ranging from about 0.25 to 0.5 microns.

16. A method of fabricating an array of pores comprising the acts of:
(a) removing a portion of an upper surface of a substrate to define a cross-shaped protrusion having a sidewall extending therefrom;
(b) disposing a layer of a first material in a conformal manner over the cross-shaped protrusion and the sidewall;
(c) disposing a layer of a second material over the layer of the first material;
(d) exposing an upper portion of the layer of the first material on the sidewall; and
(e) removing the layer of the first material on the sidewall to create a pore.

17. The method, as set forth in claim 16, wherein act (a) comprises the act of:
disposing a layer of a first dielectric material over a layer of a first conductive material.

18. The method, as set forth in claim 17, wherein the first dielectric material comprises silicon nitride.

19. The method, as set forth in claim 17, wherein the layer of the first conductive material comprises a lower electrode of a memory cell.

20. The method, as set forth in claim 16, wherein act (b) comprises the act of:
disposing a layer of silicon oxide over the cross-shaped protrusion and the sidewall.

21. The method, as set forth in claim 16, wherein act (c) comprises the act of:
disposing a layer of a second dielectric material over the layer of the first material.

22. The method, as set forth in claim 21, wherein the second dielectric material comprises silicon nitride.

23. The method, as set forth in claim 16, wherein the first material is selectively etchable relative to the second material.

24. The method, as set forth in claim 16, wherein act (d) comprises the act of:
removing a portion of the layer of the first material and a portion of the layer of the second material to expose an upper surface of the cross-shaped protrusion.

25. The method, as set forth in claim 16, wherein act (d) comprises the act of:
planarizing a portion of the layer of the first material and a portion of the layer of the second material to expose an upper surface of the cross-shaped protrusion.

26. The method, as set forth in claim 16, wherein act (e) comprises the act of:
removing a portion of the substrate to create the pore in the substrate.

27. The method, as set forth in claim 26, wherein act (e) comprises the act of:
removing the cross-shaped protrusion.

28. The method, as set forth in claim 16, further comprising the act of:
disposing a layer of a third material into the pore.

29. The method, as set forth in claim 28, wherein the third material comprises a memory material.

30. The method, as set forth in claim 29, wherein the memory material comprises a chalcogenide material.

31. The method, as set forth in claim 29, further comprising the act of:
disposing a layer of a second conductive material over the layer of the memory material.

32. The method, as set forth in claim 31, wherein the layer of the second conductive material comprises an upper electrode of a memory cell.

33. The method, as set forth in claim 16, wherein acts (a) through (e) are performed in the order recited.

34. An array of memory cells comprising:
a plurality of memory cells positioned on a substrate, each memory cell comprising:
an upper electrode;
a lower electrode;
a dielectric layer disposed between the upper electrode and the lower electrode, the dielectric layer having a pore formed therein extending from the upper electrode to the lower electrode, the pore having an L-shaped cross section; and
a memory element disposed within the pore.

35. The array, as set forth in claim 34, wherein the memory element comprises a chalcogenide material.

36. The array, as set forth in claim 34, wherein a minimum lateral dimension of each pore ranges from about 50 to 500 Angstroms.

37. The array, as set forth in claim 34, wherein pores of adjacent memory cells are spaced apart by a distance ranging from about 0.25 to 0.5 microns.

* * * * *